United States Patent
Netsu et al.

(10) Patent No.: US 10,366,882 B2
(45) Date of Patent: *Jul. 30, 2019

(54) SYSTEM FOR PRODUCING POLYCRYSTALLINE SILICON, APPARATUS FOR PRODUCING POLYCRYSTALLINE SILICON, AND PROCESS FOR PRODUCING POLYCRYSTALLINE SILICON

(71) Applicant: Shin-Etsu Chemical Co., Ltd., Tokyo (JP)

(72) Inventors: Shigeyoshi Netsu, Joetsu (JP); Kyoji Oguro, Joetsu (JP); Takaaki Shimizu, Joetsu (JP); Yasushi Kurosawa, Joetsu (JP); Fumitaka Kume, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 398 days.

This patent is subject to a terminal disclaimer.

(21) Appl. No.: 14/671,086

(22) Filed: Mar. 27, 2015

(65) Prior Publication Data

US 2015/0206745 A1    Jul. 23, 2015

Related U.S. Application Data

(62) Division of application No. 13/496,060, filed as application No. PCT/JP2010/004647 on Jul. 20, 2010, now Pat. No. 9,017,482.

(30) Foreign Application Priority Data

Sep. 14, 2009  (JP) ................................ 2009-211806

(51) Int. Cl.
  *H01L 21/02*   (2006.01)
  *C23C 16/46*   (2006.01)
  (Continued)

(52) U.S. Cl.
  CPC ........ *H01L 21/02595* (2013.01); *B01J 19/02* (2013.01); *C01B 33/035* (2013.01);
  (Continued)

(58) Field of Classification Search
  CPC ......... H01L 21/02595; H01L 21/02532; H01L 21/02636; C23C 16/463; C23C 16/4411;
  (Continued)

(56) References Cited

U.S. PATENT DOCUMENTS 3,142,584 A * 7/1964 Reuschel ............... C01B 33/035
                                              118/725
3,523,816 A * 8/1970 Cave ..................... C01B 33/035
                                              117/102

(Continued)

FOREIGN PATENT DOCUMENTS

CN          1209472 A      3/1999
DE    10 2006 029 282 A1   12/2007
(Continued)

OTHER PUBLICATIONS

AZO Materials, Stainless Steel—Grade 904L (UNS N08904), Nov. 7, 2001.*

(Continued)

*Primary Examiner* — Jeffrie R Lund
(74) *Attorney, Agent, or Firm* — Oblon, McClelland, Maier & Neustadt, L.L.P.

(57) ABSTRACT

The present invention provides a technique by which heat can be efficiently recovered from a coolant used to cool a reactor, and contamination with dopant impurities from an inner wall of a reactor when polycrystalline silicon is deposited within the reactor can be reduced to produce high-purity polycrystalline silicon. With the use of hot water 15 having a temperature higher than a standard boiling point as a coolant fed to the reactor 10, the temperature of the (Continued)

reactor inner wall is kept at a temperature of not more than 370° C. Additionally, the pressure of the hot water 15 to be recovered is reduced by a pressure control section provided in a coolant tank 20 to generate steam. Thereby, a part of the hot water is taken out as steam to the outside, and reused as a heating source for another application.

7 Claims, 4 Drawing Sheets (51) Int. Cl.
    *C23C 16/44*     (2006.01)
    *C23C 16/52*     (2006.01)
    *C23C 16/24*     (2006.01)
    *B01J 19/02*     (2006.01)
    *C01B 33/035*     (2006.01)

(52) U.S. Cl.
    CPC .......... *C23C 16/24* (2013.01); *C23C 16/4411* (2013.01); *C23C 16/463* (2013.01); *C23C 16/52* (2013.01); *H01L 21/02532* (2013.01); *H01L 21/02636* (2013.01); *B01J 2219/0236* (2013.01); *Y02P 20/124* (2015.11); *Y02P 20/129* (2015.11)

(58) Field of Classification Search
    CPC ......... C23C 16/52; C23C 16/24; B01J 19/02; B01J 2219/0236; C01B 33/035; Y02P 20/124
    See application file for complete search history.

(56) References Cited

U.S. PATENT DOCUMENTS

| | | | | |
|---|---|---|---|---|
| 4,724,160 A * | 2/1988 | Arvidson | ................ | C23C 16/46 117/88 |
| 4,786,477 A * | 11/1988 | Yoon | .......................... | B01J 8/42 118/716 |
| 4,900,411 A * | 2/1990 | Poong | ........................ | B01J 8/42 204/157.43 |
| 5,363,471 A | 11/1994 | Jones | | |
| 6,136,091 A | 10/2000 | Yamazaki et al. | | |
| 6,162,879 A * | 12/2000 | Galewski | ................. | B01J 8/067 422/131 |
| 6,688,329 B2 | 2/2004 | Murray et al. | | |
| 6,939,415 B2 * | 9/2005 | Iseda | ...................... | C21D 6/004 148/325 |
| 9,017,482 B2 * | 4/2015 | Netsu | .................... | C01B 33/035 118/724 |
| 9,193,596 B2 * | 11/2015 | Netsu | .................... | C01B 33/035 |
| 2003/0005961 A1 | 1/2003 | Murray et al. | | |
| 2005/0076976 A1 * | 4/2005 | Ide | ....................... | C21D 8/0205 148/609 |
| 2006/0191606 A1 * | 8/2006 | Ogawa | ................... | B23K 9/173 148/327 |
| 2006/0193743 A1 * | 8/2006 | Semba | .................. | C22C 38/001 420/53 |
| 2006/0270882 A1 | 11/2006 | Brown et al. | | |
| 2007/0049781 A1 | 3/2007 | Brown et al. | | |
| 2008/0089803 A1 * | 4/2008 | Okada | ..................... | C22C 38/02 420/38 |
| 2008/0107559 A1 * | 5/2008 | Nishiyama | ............ | C22C 38/001 420/38 |
| 2009/0291017 A1 * | 11/2009 | Otome | .................. | C22C 38/001 420/587 |
| 2009/0295033 A1 * | 12/2009 | Chisha | ................ | C03B 23/0252 264/319 |
| 2010/0034689 A1 * | 2/2010 | Hirata | ................... | C22C 38/001 420/41 |
| 2010/0054983 A1 * | 3/2010 | Osuki | ................... | C22C 38/001 420/38 |
| 2010/0062279 A1 * | 3/2010 | Osuki | ................ | B23K 35/3053 428/683 |
| 2010/0080902 A1 * | 4/2010 | Arifuddin | ............. | C01B 33/035 427/255.11 |
| 2010/0089024 A1 | 4/2010 | Bruckner et al. | | |
| 2010/0136443 A1 * | 6/2010 | Vincitore | ................ | C01B 3/384 429/423 |
| 2010/0170320 A1 * | 7/2010 | Sagara | ..................... | C21D 8/10 72/368 |
| 2010/0272922 A1 * | 10/2010 | Revankar | .............. | C01B 33/035 427/588 |
| 2011/0041966 A1 * | 2/2011 | Ishida | ..................... | C22C 19/07 148/674 |
| 2011/0088819 A1 * | 4/2011 | Semba | .................. | C22C 19/053 148/707 |
| 2011/0236252 A1 * | 9/2011 | Ueyama | .................. | C22C 19/055 420/445 |
| 2011/0253347 A1 | 10/2011 | Harrington | | |
| 2011/0274851 A1 | 11/2011 | Miyazawa et al. | | |
| 2011/0318909 A1 | 12/2011 | Gum et al. | | |
| 2012/0011859 A1 | 1/2012 | Black et al. | | |
| 2012/0180979 A1 | 7/2012 | Harrington | | |
| 2012/0207662 A1 * | 8/2012 | Netsu | .................... | C01B 33/035 423/349 |
| 2012/0237429 A1 * | 9/2012 | Netsu | .................... | C01B 33/035 423/349 |
| 2015/0206745 A1 * | 7/2015 | Netsu | .................... | C01B 33/035 438/488 |

FOREIGN PATENT DOCUMENTS

| | | | | |
|---|---|---|---|---|
| EP | 2 589 068 | | 5/2013 | |
| JP | 60130675 A | * | 7/1985 | |
| JP | 60168582 A | * | 9/1985 | |
| JP | 63 55112 | | 3/1988 | |
| JP | 63099457 A | * | 4/1988 | ............. F24S 10/13 |
| JP | 8-37016 | | 2/1996 | |
| JP | 8 259211 | | 10/1996 | |
| JP | 2002 299259 | | 10/2002 | |
| JP | 2005053765 A | * | 3/2005 | |
| JP | 2007-255349 | | 10/2007 | |
| JP | 4021276 B2 | * | 12/2007 | |
| JP | 2010164223 A | * | 7/2010 | |
| JP | 5605991 B2 | * | 10/2014 | |
| WO | 2012/006029 A2 | | 1/2012 | |

OTHER PUBLICATIONS

Derwint translation of JP 09-71790.*
International Search Report dated Oct. 26, 2010 in PCT/JP10/04647 Filed Jul. 20, 2010.
Extended Search Report dated Jul. 22, 2013 in European Application No. 10815098.8.
Japanese Office Action dated Sep. 3, 2013, in Japan patent Application No. 2009-211806.
Extended Search Report dated Jul. 22, 2013 in European Application No. 13166153.0.
Information Offer Form Issued Aug. 19, 2013, in Japanese Patent Application No. 2009-211806 with English translation.
Combined Office Action and Search Report dated Sep. 5, 2013 in Chinese Patent Application No. 201080040911.7 with English translation of categories of cited documents.
Information Offer Form dated Oct. 24, 2013, in Japanese Patent Application No. 2009-211806 (with part of English translation).

\* cited by examiner

SYSTEM FOR PRODUCING POLYCRYSTALLINE SILICON, APPARATUS FOR PRODUCING POLYCRYSTALLINE SILICON, AND PROCESS FOR PRODUCING POLYCRYSTALLINE SILICON

CROSS REFERENCE TO RELATED APPLICATIONS

The present application is a Divisional of U.S. application Ser. No. 13/496,060, filed on Apr. 23, 2012, which was a 35 U.S.C. § 371 national stage patent application of International patent application PCT/JP2010/004647, filed on Jul. 20, 2010, and claims the benefit of the filing date of Japanese application no. 2009-211806, filed on Sep. 14, 2009.

TECHNICAL FIELD

The present invention relates to a technique for producing polycrystalline silicon, and more specifically, relates to a technique that enables to recover heat efficiently from a coolant used to cool a reactor and to provide high-purity polycrystalline silicon simultaneously.

BACKGROUND ART

As a method for producing high-purity polycrystalline silicon used as a raw material for monocrystalline silicon for production of a semiconductor, a Siemens method and a fluidized bed reactor method are known. The Siemens method is a method in which a raw material gas containing chlorosilane is contacted with a heated silicon core, and polycrystalline silicon is grown on the surface of the silicon core by a CVD (Chemical Vapor Deposition) method. The fluidized bed reactor method is a method in which monosilane or trichlorosilane as a raw material is fed and vapor-deposited in a fluidizing gas to obtain granular polysilicon.

In a step of producing such polycrystalline silicon, a large amount of heat needs to be supplied in order to keep silicon being deposited. From the viewpoint of reduction in cost, it is preferable to recover and reuse the heat supplied in the production step. The polycrystalline silicon for production of a semiconductor is required to have extremely high purity. For this reason, it is insufficient only to realize a production process having a highly efficient heat recovery and contamination with impurities in the polycrystalline silicon during the production step needs to be prevented as much as possible.

For example, U.S. Pat. No. 4,724,160 (Patent Literature 1) discloses a system in which heat exchange is performed between a coolant used to cool a metal reactor vessel (reactor) and a steam generator to generate steam and heat is reused using the steam as a heating source (so-called, steam recovery). If such a method using heat exchange between the coolant and the steam generator is used, the temperature of the inner wall of the reactor vessel has to be a high temperature to some extent.

Patent Literature 1 exemplifies polyorganosiloxane as the coolant. In the case where polyorganosiloxane is used as the coolant, the boundary film heat transfer coefficient is relatively small due to thermal properties such as specific heat and heat conductivity of polyorganosiloxane. When polycrystalline silicon grows to increase the diameter of the polycrystalline silicon, the temperature of the inner wall surface of the steel reactor vessel reaches 400° C. or more.

If the temperature of the inner wall surface of the steel reactor vessel is not less than 400° C., the inner wall surface of the reactor vessel contacting a process gas obtained by diluting a silicon raw material gas such as trichlorosilane with hydrogen gas is gradually corroded. For this, with chemical components in steel that constitutes the inner wall surface, impurity elements such as phosphorus, arsenic, boron, and aluminum contained in the steel are also discharged into the reaction atmosphere. These impurity elements undesirably act as a dopant in the polycrystalline silicon to give an influence to resistivity, leading to drastic reduction in quality.

In consideration of such problems, Japanese Patent Laid-Open No. 8-259211 (Patent Literature 2) discloses a technique for obtaining deposited high-purity silicon by depositing silicon within a reactor formed with a material that hardly outgases.

Specifically, based on a knowledge that a heat-resistant alloy containing not less than 28% by weight of nickel hardly outgases at a temperature of not more than 600° C., the decomposition and reduction reaction of silanes are performed within a reactor vessel having an inner wall comprising a heat-resistant alloy containing not less than 28% by weight of nickel, thereby to further increase the purity of polycrystalline silicon to be obtained. Examples of the above-described "heat-resistant alloy containing not less than 28% by weight of nickel" include Incoloy 800, Inconel 600, Inconel 601, Incoloy 825, Incoloy 801, Hastelloy B, and Hastelloy C.

CITATION LIST

Patent Literature

Patent Literature 1: U.S. Pat. No. 4,724,160
Patent Literature 2: Japanese Patent Laid-Open No. 8-259211

SUMMARY OF INVENTION

Technical Problem

As described above, the polycrystalline silicon for production of a semiconductor is required to have extremely high purity. Recently, the total amount of dopant impurities needs to be not more than 100 ppt (ppt·atomic) in the atomic ratio. According to a series of tests conducted by the present inventors, however, it was found, for example, that even when polycrystalline silicon was deposited by the Siemens method within a reactor having an inner wall surface comprising Hastelloy C, the amount of dopant impurities taken into the polycrystalline silicon undesirably increased as the temperature of the inner wall of the reactor increased along with progress of the deposition reaction of polycrystalline silicon. Particularly, it was found that when the deposition reaction was performed on a condition in which a temperature of the inner wall of the reactor exceeded 370° C., the total amount of dopant impurities taken into the polycrystalline silicon exceeded 100 ppt·atomic.

Namely, in order to suppress contamination with the impurity elements from an environment of growing polycrystalline silicon and produce high-purity polycrystalline silicon, polycrystalline silicon may be grown while cooling water having a low temperature is used as a coolant and the temperature of the inner wall of the reactor is kept relatively low. Unfortunately, in the conventional cooling method using water having a low temperature, the temperature of the cooling water discharged from the reactor is lower than 100°

C., and it is substantially impossible to generate steam from the water having such a temperature to recover the heat efficiently.

The present invention has been made in consideration of the problems above, and an object of the present invention is to provide a technique by which heat can be recovered efficiently from a coolant used to cool a reactor, and contamination with dopant impurities from an inner wall of a reactor when polycrystalline silicon is deposited within the reactor can be reduced to produce high-purity polycrystalline silicon.

Solution to Problem

In order to solve the problems above, a system for producing polycrystalline silicon according to the present invention includes a reactor for producing polycrystalline silicon; a coolant tank for storing a coolant; a coolant circulation path for feeding the coolant from the coolant tank to the reactor and for recovering the coolant to the coolant tank through a coolant flow passage provided in the reactor; and an energy recovering section for taking out, for recovery of energy, a part of the coolant to be recovered to the coolant tank, wherein hot water having a temperature higher than a standard boiling point is used as the coolant fed to the reactor, steam obtained by vaporizing the hot water is taken out from the energy recovering section, and polycrystalline silicon is produced while the hot water is circulated through the reactor to control the temperature of an innermost surface of the reactor at a temperature of not more than 400° C.

Examples of preferable systems for controlling the temperature of the innermost surface of the reactor at a temperature of not more than 400° C. further include a system including a first pressure control section for reducing the pressure of the hot water and a second pressure control section for controlling pressure within the coolant tank, both control sections being provided downstream of the reactor in the coolant circulation path, wherein the hot water is flashed to generate steam and to cool the hot water simultaneously by reducing the pressure of the hot water in the first pressure control section.

Preferably, the temperature of the hot water is lower than 200° C.

In the system for producing polycrystalline silicon according to the present invention, the reactor may include an anticorrosive layer provided on the inner surface of an inner wall of the reactor, wherein the anticorrosive layer comprises a first alloy material having a composition having a value R, defined by R=[Cr]+[Ni]−1.5 [Si], of not less than 40%, wherein [Cr] is a mass content (% by mass) of chromium (Cr), [Ni] is, a mass content (% by mass) of nickel (Ni), and [Si] is a mass content (% by mass) of silicon (Si).

Preferably, the value R is not less than 60%.

For example, respective mass contents (% by mass) of Cr, Ni, and Si contained in the first alloy material are as follows: [Cr] is in a range of 14.6 to 25.2% by mass, [Ni] is in a range of 19.6 to 77.5% by mass, and [Si] is in a range of 0.3 to 0.6% by mass.

In the system for producing polycrystalline silicon according to the present invention, the temperature of the innermost surface of the reactor when polycrystalline silicon is deposited within the reactor is preferably controlled at a temperature of not more than 370° C.

In the system for producing polycrystalline silicon according to the present invention, a heat conductive layer comprising a second alloy material having a heat conductivity higher than that of the first alloy material may be provided on the outside of the anticorrosive layer of the inner wall of the reactor.

In the system for producing polycrystalline silicon according to the present invention, the coolant flow passage may be provided on the outside of the anticorrosive layer of the inner wall of the reactor.

In the system for producing polycrystalline silicon according to the present invention, the coolant tank can include a solution level control section for detecting a solution level of hot water stored in the coolant tank and for replenishing a shortage of the hot water.

The system for producing polycrystalline silicon according to the present invention can include a hot water feeding pump in the coolant circulation path for feeding the coolant from the coolant tank to the reactor.

The system for producing polycrystalline silicon according to the present invention is effective particularly in production of polycrystalline silicon having a total amount of dopant impurities of not more than 100 atomic ppt.

Using such a system for producing polycrystalline silicon, a silicon raw material gas can be fed while the temperature of an innermost surface of an inner wall of the reactor is controlled at a temperature of less than 400° C., thereby to obtain polycrystalline silicon.

Moreover, a process for producing polycrystalline silicon according to the present invention comprises generating steam during growth of polycrystalline silicon while keeping the temperature of an inner wall surface of a reactor at not more than 370° C., wherein the inner wall surface of the reactor which contacts a process gas comprises a steel type containing an alloy for which a value of a relational expression in mass content (% by mass) among chromium, nickel, and silicon, [Cr]+[Ni]−1.5 [Si], is not less than 40%.

Further, an apparatus for producing polycrystalline silicon according to the present invention includes a reactor for producing polycrystalline silicon and a coolant circulation path for cooling the reactor using hot water having a temperature higher than a standard boiling point, wherein the hot water discharged from the reactor is flashed to generate steam.

In the present invention, the hot water used as the coolant is reused as the steam. Thereby, the heat can be efficiently recovered from the coolant used to cool the reactor.

Moreover, in the present invention, the anticorrosive layer comprising the first alloy material having a composition for which a value R, defined by R=[Cr]+[Ni]−1.5 [Si], is not less than 40% is provided on the inner surface of the inner wall of the reactor, wherein a mass content (% by mass) of chromium (Cr) is [Cr], a mass content (% by mass) of nickel (Ni) is [Ni], and a mass content (% by mass) of silicon (Si) is [Si]. Consequently, while the temperature of the reactor is kept relatively high by using the hot water as the coolant to generate the steam, contamination with dopant impurities from the inner wall of the reactor when polycrystalline silicon is deposited within the reactor can be reduced to obtain high-purity polycrystalline silicon.

DESCRIPTION OF EMBODIMENT

Hereinafter, with reference to the drawings, an embodiment according to the present invention will be described.

Figure 1:
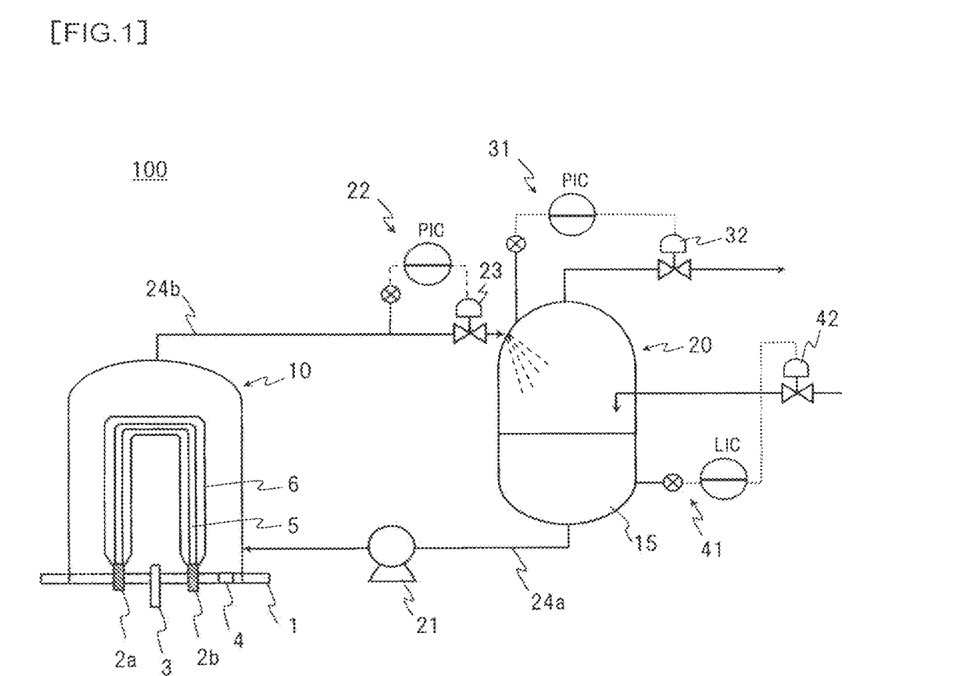
FIG. 1 is a drawing illustrating an example of a configuration of a polycrystalline silicon producing system according to the present invention.

FIG. 1 is a drawing illustrating an example of a configuration of a system for producing polycrystalline silicon according to the present invention. The drawing shows a polycrystalline silicon producing system 100 in which polycrystalline silicon is deposited by the Siemens method.

A reactor 10 is provided on a baseplate 1. Within the reactor 10, an approximately U-shaped silicon core 5 is set, and both ends of the silicon core 5 are connected to electrodes 2a and 2b, respectively, to be electrically conductive. A raw material gas such as trichlorosilane gas for depositing polycrystalline silicon and a process gas such as nitrogen gas and hydrogen gas are fed from a gas nozzle 3 into the reactor 10. By vapor deposition, polycrystalline silicon 6 is deposited on the surface of the silicon core 5 heated by feeding the current from the electrodes 2a and 2b. The gas within the reactor 10 is discharged from a vent 4. In the present invention, by adjusting a flow rate of a coolant (hot water) 15 described later, the temperature of the innermost surface of the reactor is controlled at a temperature of less than 400° C.

A coolant tank 20 stores hot water 15 as a coolant. The hot water 15 is fed by a hot water feeding pump 21 provided in a coolant circulation path 24a from the coolant tank 20 to the lower portion of the reactor 10. The hot water 15 is passed through a coolant flow passage 13 (described later) provided in the reactor 10, and discharged from the upper portion of the reactor 10.

The pressure of the hot water 15 discharged from the upper portion of the reactor 10 is detected by a first pressure control section, namely, a pressure indicator controller PIC 22 provided in the coolant circulation path 24b. A degree of opening of a control valve 23 is controlled to prevent boiling of the hot water as the coolant in the coolant flow passage. After the hot water is passed through the pressure valve, the hot water is flashed, and part of the hot water becomes steam. The hot water 15 is recovered to the coolant tank 20 while the hot water 15 is cooled.

The pressure within the coolant tank 20 increased along with the generation of the steam is detected by a second pressure control section, namely, a pressure indicator controller PIC 31. The steam is recovered through a control valve 32. Namely, part of the coolant recovered to the coolant tank 20 can be taken out as steam, and reused as a heating source for another application. The temperature of the hot water fed to the reactor 10 is uniquely manageable by the second pressure control section. Alternatively, the temperature of the hot water can be managed by direct detection of the temperature of the coolant, instead of the above pressure control mechanism.

The temperature of the innermost surface of the reactor can be calculated from the temperature of the hot water serving as the above temperature-controlled coolant (the pressure of the coolant tank 20), the amount of the hot water to be circulated, the amount of the steam taken out, the amount of the energy to be applied to perform the production reaction of the polycrystalline silicon 6 in the reactor 10, the heat conductivity based on the structure and material of the reactor 10, and calculation of the heat balance using an arrangement or the like of the silicon core 5 arranged for production of the polycrystalline silicon 6. When these reaction conditions are determined, the target temperature of the innermost surface of the reactor can be controlled at not more than 400° C., preferably not more than 370° C., by controlling the pressure within the coolant tank and the amount of the hot water to be circulated as described above.

Alternatively, the temperature of the outlet of the coolant flow passage is measured and the amount of heat-removal energy is determined based on the temperature in the coolant tank and the amount of the hot water to be circulated so that an estimated value of the temperature of the innermost surface of the reactor can be determined by a heat conductivity based on the structure and material of the reactor.

In the present invention, for the reason below, the hot water having a temperature higher than the standard boiling point (100° C.) is used as the coolant fed to the reactor 10.

In the prior art, use of a variety of silicone oils and hydrocarbon oils as the coolant for the reactor 10 is known. These coolants have a relatively low boundary film heat transfer coefficient. For this reason, when a polycrystalline silicon rod is grown by the Siemens method or the like, the temperature of a silicone oil or a hydrocarbon oil as the coolant needs to be reduced to approximately 100° C. and the coolant needs to be fed to the reactor 10 in order to keep the temperature of the inner wall surface of the reactor 10, for example, not more than 370° C. immediately before the reaction is completed, in which the diameter of the polycrystalline silicon rod is increased.

In such a case, the temperature of the coolant discharged from the reactor 10 is approximately 130° C. By heat exchange between the coolant having the temperature above and water, the temperature of the coolant needs to be reduced to approximately 100° C. and the coolant needs to be circulated and used. Additionally, the steam needs to be generated for heat recovery. Unfortunately, the coolant having the temperature of approximately 130° C. has difficulties to efficiently generate the steam.

In contrast, water can have an extremely large boundary film heat transfer coefficient and thus is effective as the coolant. If the temperature of the water to be fed is not more than 100° C., the temperature of the water discharged from the reactor 10 is approximately 120° C. at most. Additionally, the temperature of the water needs to be decreased to not more than 100° C. for the purpose of circulation use. Accordingly, water is not practical from the viewpoint of recovery of the steam.

Then, in the present invention, the hot water having a temperature more than the standard boiling point of water (i.e., 100° C.) is used as the coolant. According to the examination by the present inventors, in the case where polycrystalline silicon is grown by the Siemens method, when the hot water of 125° C., for example, is fed to the reactor 10 immediately before the reaction to increase the diameter of the polycrystalline silicon rod is completed, the temperature of the hot water discharged from the reactor 10 is 141° C. At this time, the temperature of the inner surface of the reactor is cooled to approximately 231° C. on the hot water outlet end side in which the temperature is highest, and the temperature of the inner wall surface of the reactor 10 can be sufficiently kept at a temperature of not more than 370° C. Moreover, if the temperature of the hot water discharged from the reactor 10 is 141° C., when the pressure of the hot water is controlled (reduced) and the hot water is flashed, the hot water itself becomes steam. The heat exchange between the coolant and the steam generator is unnecessary, and the heat can be efficiently recovered.

If the hot water having a temperature of not less than 200° C. is used for the reactor 10, the vapor pressure when the hot water is discharged from the reactor 10 is as high as not less than 2 MPaG. For this reason, practically, the temperature of the hot water is desirably more than 100° C. and less than 200° C.

In the case where the hot water having a temperature more than the standard boiling point is used as the coolant, boiling of the hot water may cause problems such as unstable flow of the hot water in the coolant flow passage. Accordingly, the pressure of the hot water is preferably controlled by the pressure exceeding the vapor pressure at the boundary film temperature to prevent boiling of the hot water on a heat removing surface boundary film in the reactor 10. The boiling is prevented by the first pressure control valve 23. Further, the pressure indicator controller PIC 31 that detects the pressure within the coolant tank 20 and the control valve 32 controls the pressure within the coolant tank 20. Thereby, the temperature of the hot water in the coolant tank 20 is controlled.

A level controller LIC 41 detects the height of the solution level of the hot water 15 in the coolant tank 20, and controls the degree of opening of a control valve 42 to feed an amount of pure water equivalent to or slightly larger than the amount of the hot water 15 lost by the recovery of the steam. The hot water 15 in the coolant tank 20 is circulated through the hot water feeding pump 21 to the reactor 10.

Figure 2:
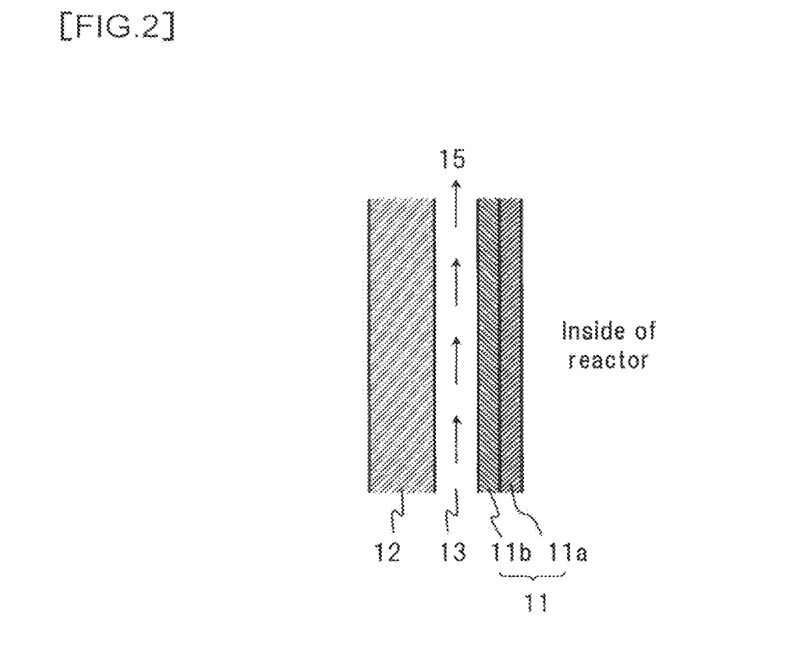
FIG. 2 is a sectional view illustrating a structure (an inner wall, an outer wall, and a coolant flow passage) of a wall portion of a reactor for producing polycrystalline silicon according to the present invention.

FIG. 2 is a sectional view illustrating the structure of the wall portion of the reactor 10 according to the present invention. The coolant flow passage 13 for circulating the hot water 15 as the coolant is, for example, spirally provided on an outer side of an inner wall 11, namely, between the inner wall 11 on the inner side of the reactor and an outer wall 12 on the outer side of the reactor. The hot water 15 is fed from the lower portion of the reactor 10 and discharged from the top of the reactor 10.

The inner wall 11 has a two-layer structure: an anticorrosive layer 11a comprising a highly anticorrosive alloy material is provided on the inner side of the reactor contacting a corrosive process gas, and a heat conductive layer 11b for efficiently conducting the heat within the reactor 10 from the inner wall surface to the coolant flow passage 13 is provided on the outer side of the reactor (outer-wall side).

The heat conductive layer 11b comprises an alloy material having a heat conductivity higher than that of the alloy material used in the anticorrosive layer 11a. For example, the heat conductive layer 11b comprises a material such as SB steel (carbon steel for boilers and pressure containers) and SGV steel (carbon steel for mid and normal temperature pressure containers). The heat conductive layer 11b is not limited to those comprising a single steel material, and may be those comprising a clad steel material having several kinds of metals applied to each other.

For the reason described later, the alloy material used for the anticorrosive layer is an alloy material having a composition for which a value R, defined by R=[Cr]+[Ni]−1.5 [Si], is not less than 40%, wherein [Cr] is a mass content (% by mass) of chromium (Cr), [Ni] is a mass content (% by mass) of nickel (Ni), and [Si] is a mass content (% by mass) of silicon (Si). Preferably, an alloy material having a value R of not less than 60% is selected.

The following describes a corrosiveness test which is the background that leads to the selection of the alloy material having the above composition.

The corrosiveness test was performed as follows: as a sample, a variety of alloy materials were cut into a test piece having a length of 30 mm, a width of 25 mm, and a thickness of 2 mm; the weight of the test piece was precisely weighed, and hung in a highly heated portion in a quartz reactor prepared as a test reactor; an exhaust gas discharged from the polycrystalline silicon reactor was introduced into the quartz reactor; and after a predetermined time at a predetermined temperature had passed, the weight of the test piece was weighed to determine change in the weight.

As a first condition selected, the temperature was 200° C. and the time was 9 days. As the second condition selected, the temperature was 300° C. and the time was 9 days. Under these first and second conditions, the corrosiveness test was performed.

First, an exhaust gas within the quartz reactor is replaced by nitrogen. Further, nitrogen is replaced by hydrogen. Part of the gas discharged from a Siemens type polycrystalline silicon reactor is introduced into the quartz reactor in which a test piece is hung in a highly heated portion. The exhaust gas discharged from the polycrystalline silicon reactor is a mixed gas containing $H_2$, HCl, and $SiH_nCl_{4-n}$ (n=0 to 3) as principal components.

After the corrosiveness test was completed, the exhaust gas introduced into the quartz reactor was changed to hydrogen to cool the quartz reactor. Next, hydrogen was replaced with nitrogen, and the reactor was opened to the air. Then, the test piece was taken out from the quartz reactor, washed by water, and dried. The weight of the test piece was precisely weighed. As a result, under the first and second conditions, change in the weight was hardly found in any of the test pieces comprising the respective alloy materials. Namely, it was confirmed that at a temperature in the range of not less than 200° C. and not more than 300° C., the alloy materials that constitute the inner wall surface are hardly corroded.

Then, in order to accelerate corrosion of the alloy material, a temperature at 400° C. and a time of 19 days were selected as a third condition, and a temperature of 500° C. and a time of 19 days as a fourth condition. Again, the corrosiveness test was performed in the same manner as above except the temperature and the time.

Figure 3:
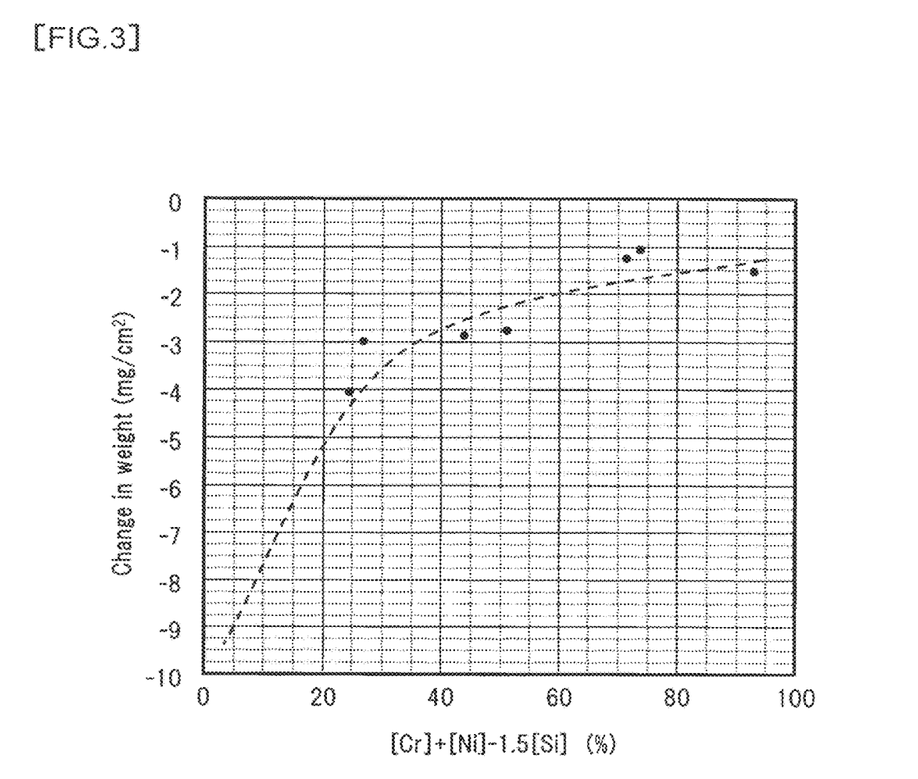
FIG. 3 is a drawing showing dependency of corrosiveness of a Cr—Ni—Si alloy material on a composition (mass content (% by mass): R=[Cr]+[Ni]−1.5 [Si]).

Table 1 and FIG. 3 show the results of the corrosiveness test performed under the third condition (temperature of 400° C., time: 19 days). Table 1 shows a specific composition of the alloy materials (kinds of steel) and change in the weight after the corrosiveness test. FIG. 3 is a graph of the result wherein the abscissa represents an alloy composition (R=[Cr]+[Ni]−1.5 [Si]) and the ordinate represents change in the weight after the corrosiveness test.

"NAR" is a registered trademark of Sumitomo Metal Industries, Ltd. "Incoloy" and "Inconel" are registered trademarks of Inco Limited. "Hastelloy" is a registered trademark of Haynes-Stellite Company. "Carpenter" is a registered trademark of Carpenter Technology Corporation.

TABLE 1

| Alloy material (steel type) | [Cr] (%) | [Ni] (%) | [Si] (%) | [Cr] + [Ni] − 1.5[Si] (%) | Change in weight (mg/cm$^2$) |
|---|---|---|---|---|---|
| NAR-SN-1 | 17.2 | 13.9 | 4.3 | 24.7 | −4.05 |
| SUS-305B | 19.2 | 13.0 | 3.5 | 27.0 | −3.01 |

TABLE 1-continued

| Alloy material (steel type) | [Cr] (%) | [Ni] (%) | [Si] (%) | [Cr] + [Ni] − 1.5[Si] (%) | Change in weight (mg/cm²) |
|---|---|---|---|---|---|
| SUS-310S | 25.2 | 19.6 | 0.5 | 44.1 | −2.87 |
| Incoloy 800 | 20.5 | 31.3 | 0.3 | 51.4 | −2.78 |
| Hastelloy C | 15.0 | 57 | 0.4 | 71.4 | −1.25 |
| NAR-25-50MTi | 24.9 | 49.8 | 0.6 | 73.8 | −1.07 |
| Inconel 600 | 14.6 | 77.5 | 0.37 | 92.7 | −1.53 |

As for a steel type in which the value of the relational expression in mass content (% by mass) among chromium, nickel, and silicon, R=[Cr]+[Ni]−1.5 [Si], is less than 40%, as apparent from Table 1 and FIG. 3, when this steel type is used as a material for the inner wall of the reactor, corrosion thereof is easily promoted in deposition of polycrystalline silicon within the reactor.

Namely, as the material for the anticorrosive layer provided in the inner wall of the reactor for producing polycrystalline silicon, the alloy material preferably has a value R of not less than 40%, and more preferably a value R of not less than 60%. In the corrosiveness test on the fourth condition (temperature of 500° C., time: 19 days), a more marked change in the weight was found in compared with the corrosiveness test on the third condition.

EXAMPLE 1

Based on the examination above, reactors were produced using a steel type that satisfies the condition of the value R of not less than 40%, i.e., SUS310S (value R: 41 to 46%) or Hastelloy C (value R: not less than 62%) as the anticorrosive layer for the inner wall. Using these reactors, polycrystalline silicon was actually deposited. Dependency of the concentration of dopant impurities in the obtained polycrystalline silicon rod on the temperature of the inner wall surface was examined.

While hydrogen gas and trichlorosilane gas as the principal raw material were fed from the gas nozzle 3 into each reactor 10 having the anticorrosive layer for the inner wall which anticorrosive layer comprised the steel type SUS310S or Hastelloy C, growth of a polycrystalline silicon rod was performed at a temperature of not less than 1000° C. and not more than 1100° C. to obtain a polycrystalline silicon rod having a diameter of 120 to 130 mm.

Figure 4:
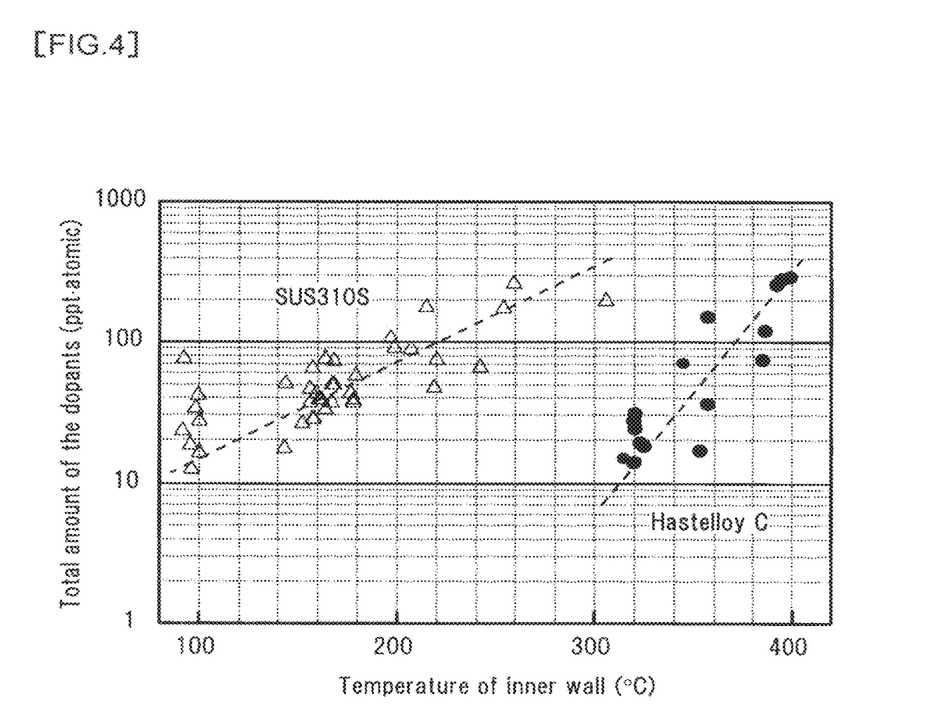
FIG. 4 is a drawing showing a relationship between a temperature of the inner wall surface on a coolant outlet end side immediately before a polycrystalline silicon deposition step is completed and a concentration of dopant impurities taken into polycrystalline silicon in a reactor having an inner wall comprising a Cr—Ni—Si alloy material, wherein the Cr—Ni—Si alloy material is SUS310S and Hastelloy C.

FIG. 4 is a drawing showing a relationship between the temperature of the inner wall surface (the abscissa) on the coolant outlet end side immediately before the polycrystalline silicon deposition step is completed and the concentration of dopant impurities taken into polycrystalline silicon in the respective reactors having the inner wall comprising a Cr—Ni—Si alloy material, i.e., SUS310S or Hastelloy C. The total amount of the dopants shown by the ordinate is the total amount of the dopants obtained by a photoluminescence analysis, and specifically, the sum of the contents of phosphorus, arsenic, boron, and aluminum.

Because of a practical demand in control of the resistivity during growth of the CZ single-crystal or FZ single-crystal used for the semiconductor, the total amount of the dopants in polycrystalline silicon is desirably not more than 100 atomic ppt. As shown in FIG. 4, in the case where SUS310S is used for the inner wall surface, by keeping the temperature of the inner wall surface at not more than 220° C., the total amount of the dopants of not more than 100 atomic ppt can be obtained in polycrystalline silicon. In the case where Hastelloy C is used for the inner wall surface, by keeping the temperature of the inner wall surface not more than 370° C., the total amount of the dopants not more than 100 atomic ppt can be obtained in polycrystalline silicon.

Table 2 shows examples of alloy materials for which a value R, defined by R=[Cr]+[Ni]−1.5 [Si], is not less than 40% and which are preferable as the material for the anticorrosive layer provided in the inner wall of the reactor for producing polycrystalline silicon.

TABLE 2

| Alloy material (steel type) | [Cr] (%) | [Ni] (%) | [Si] (%) | [Cr] + [Ni] − 1.5[Si] (%) |
|---|---|---|---|---|
| SUS310S | 24-26 | 19-22 | ≤1.5 | 41-46 |
| Carpenter 20 | 19-22 | 28-30 | ≤1 | 45-50 |
| Incoloy 800 | 18-23 | 28-35 | ≤0.5 | 45-57 |
| Hastelloy C | 14-17 | ≥50 | ≤1 | ≥62 |
| Inconel 600 | 14-17 | ≥72 | ≤0.5 | ≥85 |

Using the reactor according to the present invention, the deposition reaction of polycrystalline silicon is performed. The procedure is mainly as follows. First, the silicon core 5 is connected to the electrodes 2, and the reactor 10 is closely placed on the baseplate 1. Nitrogen gas is fed from the gas nozzle 3 to replace the air within the reactor 10 with nitrogen. The air and nitrogen within the reactor 10 are discharged from the vent 4.

After replacement of the air within the reactor 10 with a nitrogen atmosphere is started, the hot water 15 is fed to the coolant flow passage 13, and heating of the inside of the reactor 10 is started. After replacement of the air within the reactor 10 with a nitrogen atmosphere is completed, hydrogen gas is fed from the gas nozzle 3 instead of nitrogen gas to provide a hydrogen atmosphere within the reactor 10.

Next, using a heater not shown, the silicon core 5 is preheated to the temperature of not less than 250° C. to provide the conductivity such that the current efficiently flows. Subsequently, the current is supplied from the electrodes 2 to the silicon core 5 to heat the silicon core 5 to the temperature of not less than 900° C. Further, along with hydrogen gas, trichlorosilane gas is fed as a raw material gas, vapor deposition is performed on the silicon core 5 at the temperature in the range of not less than 900° C. and not more than 1200° C. to obtain the polycrystalline silicon 6. The unreacted gas and the by-product gas are discharged from the vent 4.

During a period of time from the start of heating the silicon core 5 to the step of the deposition reaction of the polycrystalline silicon 6 (or cooling of the polycrystalline silicon rod after the deposition reaction step is completed), the hot water 15 is fed as the coolant to cool the reactor 10. At least during the deposition reaction of the polycrystalline silicon 6, a sufficient amount of the coolant is determined by calculation of the heat balance such that by keeping the pressure within the coolant tank 20 at 0.15 MPaG by a second pressure control section including the pressure indicator controller 31 and the pressure control valve 32, the temperature of the hot water 15 fed to the reactor 10 is kept at 125 to 127° C., the temperature of the inner wall surface of the reactor 10 is kept at the temperature of not more than 370° C., and the temperature of the hot water outlet in the reactor does not exceed 200° C.; and the obtained hot water is fed to the reactor by the hot water feeding pump 21.

The temperature of the hot water 15 fed as the coolant that cools the reactor 10 is set in the range of more than 100° C. exceeding the standard boiling point and less than 200° C., as described above. In order to prevent boiling in the heat removing surface boundary film of the heat conductive layer 11b, the pressure of the hot water 15 is controlled at the pressure exceeding the vapor pressure at the boundary film temperature by the pressure control valve 23 of the first pressure control section.

The hot water 15 having a controlled pressure is fed by the hot water feeding pump 21 from the lower portion of the reactor 10. The hot water 15 is passed through the coolant flow passage 13 contacting the heat conductive layer 11b to cool the inner wall 11, and heated by the heat conductive layer 11b to increase the temperature of the hot water, and discharged from the upper portion of the reactor 10.

After the polycrystalline silicon 6 is grown to have a desired diameter, the raw material gas and the current fed to the polycrystalline silicon 6 are stopped in this order, and the temperature of the inside of the reactor 10 is reduced. After the temperature of the inside of the reactor 10 is sufficiently reduced, the hot water 15 is switched to cool water, and the reactor 10 is cooled to the temperature around room temperature. Finally, the atmosphere within the reactor 10 is replaced from hydrogen to nitrogen, the reactor 10 is opened to the air, and the grown polycrystalline silicon 6 is extracted.

EXAMPLE 2

In a reactor 10 having an inner wall 11 including an anticorrosive layer 11a made of Hastelloy C and a heat conductive layer 11b of SB (carbon steel for boilers and pressure containers) and having two coolant flow passages 13, while the hot water 15 of 125° C. to 127° C. was fed to the two coolant flow passages 13 at 72 m³/hr, the pressure of the hot water was controlled by the pressure indicator controller PIC 22 at 0.5 MPaG.

During the control of the pressure, while a silicon core 5 of a 7-mm square was electrically conducted and heated to approximately 1060° C. in a hydrogen atmosphere, trichlorosilane gas as the principal raw material was fed for a growth time of approximately 80 hours to obtain a polycrystalline silicon 6 having a diameter of approximately 120 mm.

The temperature of the hot water 15 discharged from the reactor 10 was 129° C. when electrical conduction was started, and 141° C. when the reaction was completed. Table 3 shows the result of analyzing the heat transfer when electrical conduction of the reactor was started and when the reaction was completed. The calculated surface temperature of the anticorrosive layer 11a on the hot water outlet end side was 231° C. at the maximum.

The pressure of the hot water 15 discharged from the reactor 10 is kept at 0.5 MPaG (boiling temperature of the hot water of 158° C.) by the pressure indicator controller PIC 22. Accordingly, the hot water 15 does not boil within the coolant flow passage 13 (because the boiling temperature of the hot water exceeds the surface temperature on the flow passage side of the heat conductive layer of 152° C.). Moreover, by keeping the pressure within the coolant tank 20 at 0.15 MPaG by the pressure indicator controller 31, the temperature of the hot water 15 fed to the reactor 10 can be stably kept at 125 to 127° C., and the steam can be taken out from the control valve 32. The steam could be recovered at 0.4 ton/hr at an initial stage of the reaction and at 3.5 ton/hr at a final stage of the reaction. This heat recovery is equivalent to approximately 65% of the amount of electricity fed to the reactor 10 by applying current thereto.

INDUSTRIAL APPLICABILITY

In the present invention, hot water itself used as a coolant is reused as steam. Accordingly, heat can be efficiently recovered from the coolant used to cool the reactor.

Further, as a material for the anticorrosive layer provided on the inner side of the inner wall of the reactor, an alloy material having a composition in which a value R, defined by R=[Cr]+[Ni]−1.5 [Si], is not less than 40% is used. Consequently, it is possible to provide a technique to obtain high-purity polycrystalline silicon by reducing contamination with dopant impurities from the inner wall of the reactor when polycrystalline silicon is deposited within the reactor, while maintaining the reactor at a relatively high temperature by using hot water as the coolant to generate steam.

REFERENCE SIGNS LIST

1 Baseplate
2a, 2b Electrode
3 Gas nozzle
4 Vent
5 Silicon core
6 Polycrystalline silicon
10 Reactor (reaction vessel)
11 Inner wall
11a Anticorrosive layer
11b Heat conductive layer
12 Outer wall
13 Coolant flow passage
15 Hot water
20 Coolant tank
21 Hot water feeding pump
22 Pressure indicator controller
32 Control valve
24a, 24b Coolant circulation path
31 Pressure indicator controller
32 Control valve

TABLE 3

| | Hot water inlet end side of reactor | | Hot water outlet end side of reactor | |
|---|---|---|---|---|
| | Surface temperature of heat conductive layer on flow passage side (° C.) | Surface temperature of anticorrosive layer on reactor inner side (° C.) | Surface temperature of heat conductive layer on flow passage side (° C.) | Surface temperature of anticorrosive layer on reactor inner side (° C.) |
| Start of electrical conduction | 129 | 139 | 131 | 141 |
| End of reaction | 140 | 218 | 152 | 231 |

41 Level controller
42 Control valve
100 Polycrystalline silicon producing system

The invention claimed is:

1. A process for producing polycrystalline silicon, comprising generating steam during growth of polycrystalline silicon while keeping a temperature of an inner wall surface of a reactor at not more than 370° C., wherein the inner wall surface of the reactor which contacts a process gas comprises a steel type comprising an alloy for which a value of a relational expression in mass content percentage among chromium, nickel, and silicon, [Cr]+[Ni]−1.5 [Si], is not less than 40%,
  wherein water is removed and returned to said reactor via a coolant circulation path, which comprises a first pressure control section, a second pressure control section, and a coolant tank,
  wherein said steam is generated by feeding hot water, having a temperature higher than a standard boiling point, to said reactor, then vaporizing a portion of said hot water,
  where the pressure of said hot water is reduced so that a portion of said hot water itself is flashed into said steam,
  wherein the pressure of water discharged from said reactor is controlled by said first pressure control section and the pressure in said coolant tank is controlled by said second pressure control section, and
  said hot water is flashed to generate steam and to cool the hot water simultaneously by reducing the pressure of the hot water in the first pressure control section,
  wherein said first pressure control section comprises a first pressure indicator controller and a first pressure control valve configured for reducing the pressure of said hot water, and said second pressure control section comprises a second pressure indicator controller and a second pressure control valve configured for controlling pressure within said coolant tank.

2. The process of claim 1, wherein the value [Cr]+[Ni]−1.5 [Si] is not less than 60%.

3. The process of claim 1, wherein [Cr] is in a range of 14.6 to 25.2% by mass, [Ni] is in a range of 19.6 to 77.5% by mass, and [Si] is in a range of 0.3 to 0.6% by mass.

4. The process of claim 1, wherein the temperature of said hot water fed into said reactor is less than 200° C.

5. The process of claim 1, wherein the polycrystalline silicon produced has a total amount of dopant impurities of not more than 100atomic ppt.

6. A process for producing polycrystalline silicon, comprising producing polycrystalline silicon in a reactor which is cooled by feeding hot water having a temperature higher than a standard boiling point to said reactor, wherein said hot water discharged from said reactor is flashed to generate steam,
  wherein water is removed and returned to said reactor via a coolant circulation path, which comprises a first pressure control section, a second pressure control section, and a coolant tank,
  where the pressure of said hot water is reduced so that a portion said hot water itself is flashed into said steam,
  wherein the pressure of water discharged from said reactor is controlled by said first pressure control section and the pressure in said coolant tank is controlled by said second pressure control section, and
  said hot water is flashed to generate steam and to cool the hot water simultaneously by reducing the pressure of the hot water in the first pressure control section,
  wherein said first pressure control section comprises a first pressure indicator controller and a first pressure control valve configured for reducing the pressure of said hot water, and said second pressure control section comprising a second pressure indicator controller and a second pressure control valve configured for controlling pressure within said coolant tank.

7. The process of claim 6, wherein the temperature of said hot water fed into said reactor is less than 200° C.

* * * * *